(12) United States Patent
Kuperman et al.

(10) Patent No.: US 11,432,375 B2
(45) Date of Patent: Aug. 30, 2022

(54) PROTECTIVE WINDOW FOR RESISTIVE HEATING

(71) Applicant: Adasky, Ltd., Yokneam Illit (IL)

(72) Inventors: Vitaly Kuperman, Maalot (IL); Eyal Madar, Haifa (IL)

(73) Assignee: Adasky, Ltd., Yokneam Illit (IL)

( * ) Notice: Subject to any disclaimer, the term of this patent is extended or adjusted under 35 U.S.C. 154(b) by 320 days.

(21) Appl. No.: 15/799,436

(22) Filed: Oct. 31, 2017

(65) Prior Publication Data
US 2019/0132907 A1    May 2, 2019

(51) Int. Cl.
| H05B 3/84 | (2006.01) |
| H04N 5/33 | (2006.01) |
| H05B 3/14 | (2006.01) |
| H05K 1/02 | (2006.01) |

(52) U.S. Cl.
CPC ........... *H05B 3/84* (2013.01); *H04N 5/33* (2013.01); *H05B 3/141* (2013.01); *H05B 2203/011* (2013.01); *H05K 1/028* (2013.01); *H05K 2201/10189* (2013.01)

(58) Field of Classification Search
CPC ............ H04N 5/33; H05B 3/84; G02B 1/02
See application file for complete search history.

(56) References Cited

U.S. PATENT DOCUMENTS

| 5,099,105 | A | * | 3/1992 | Goerenz | ........... B32B 17/10036 |
| | | | | | 219/203 |
| 5,173,443 | A | * | 12/1992 | Biricik | ...................... G02B 1/10 |
| | | | | | 438/72 |
| 5,178,464 | A | | 1/1993 | Fraden | |
| 5,414,439 | A | | 5/1995 | Groves et al. | |
| 5,602,389 | A | | 2/1997 | Kato et al. | |
| 5,613,968 | A | | 3/1997 | Lin | |
| 5,818,631 | A | * | 10/1998 | Askinazi | ................ G02B 1/105 |
| | | | | | 359/350 |
| 6,559,447 | B2 | | 5/2003 | Wood | |

(Continued)

FOREIGN PATENT DOCUMENTS

| CN | 204031303 U | 12/2014 |
| CN | 205175557 U | 4/2016 |

(Continued)

OTHER PUBLICATIONS

Translation of applicant cited DE102007042268A1 (Year: 2009).*
(Continued)

*Primary Examiner* — Nicholas G Giles
(74) *Attorney, Agent, or Firm* — M&B IP Analysts, LLC

(57) ABSTRACT

A window for resistive heating and a camera apparatus including a window for resistive heating. The window includes a transparent member having an outer edge, wherein the transparent member is made of a first material, wherein the first material is a low conductivity material; and at least one set of two conductive pads disposed on the outer edge of the transparent member and electrically coupled to at least one source of electricity, wherein each conductive pad is made of a second material, wherein matter disposed on the transparent member is removed via resistive heating when electricity is conducted from the at least one source through the at least one set of two conductive pads and the transparent member.

20 Claims, 4 Drawing Sheets

(56) References Cited

U.S. PATENT DOCUMENTS

| | | |
|---|---|---|
| 6,759,949 B2 | 7/2004 | Miyahara |
| 7,297,938 B2 | 11/2007 | Fauci et al. |
| 7,348,562 B2 | 3/2008 | Irani |
| 7,402,802 B1 | 7/2008 | Terre et al. |
| 7,422,365 B2 | 9/2008 | Chamberlain et al. |
| 7,862,593 B2 | 1/2011 | Clement et al. |
| 7,965,336 B2 | 6/2011 | Bingle et al. |
| 8,373,757 B1 | 2/2013 | Nguyen |
| 8,471,911 B2 | 6/2013 | Kallhammer et al. |
| 8,581,982 B1 | 11/2013 | Haley et al. |
| 8,663,106 B2 | 3/2014 | Stivoric et al. |
| 8,743,207 B2 | 6/2014 | Boulanger et al. |
| 8,759,717 B2 | 6/2014 | Chamberlain |
| 8,791,878 B2 | 7/2014 | Yamazaki et al. |
| 9,061,632 B2 | 6/2015 | Toyofuku |
| 9,090,205 B2 | 7/2015 | Nagaoka et al. |
| 9,377,363 B2 | 6/2016 | Boulanger et al. |
| 9,555,736 B2 | 1/2017 | Solar et al. |
| 10,175,112 B1 | 1/2019 | Kuperman et al. |
| 10,591,358 B2 | 3/2020 | Kuperman et al. |
| 10,666,880 B2 | 5/2020 | Kuybeda et al. |
| 2002/0162963 A1 | 11/2002 | Lannestedt et al. |
| 2003/0146199 A1 | 8/2003 | Sol et al. |
| 2006/0171704 A1* | 8/2006 | Bingle .............. B60R 11/04 396/419 |
| 2007/0216768 A1 | 9/2007 | Smith et al. |
| 2008/0000892 A1* | 1/2008 | Hirano .............. B01L 3/50851 219/433 |
| 2008/0110254 A1* | 5/2008 | Zhao .............. B64D 15/20 73/170.17 |
| 2008/0203079 A1 | 8/2008 | Veerasamy et al. |
| 2009/0062859 A1 | 3/2009 | Mahoney et al. |
| 2009/0110151 A1* | 4/2009 | Damento .............. G01T 1/20 378/167 |
| 2010/0237055 A1 | 9/2010 | Rousseau et al. |
| 2012/0209332 A1 | 8/2012 | Janowski |
| 2013/0062228 A1* | 3/2013 | Danilov .............. G02B 27/0006 206/216 |
| 2013/0235163 A1 | 9/2013 | Joo |
| 2014/0027433 A1 | 1/2014 | Lisinski et al. |
| 2014/0092257 A1 | 4/2014 | Hogasten et al. |
| 2014/0098238 A1 | 4/2014 | Boulanger et al. |
| 2016/0075211 A1 | 3/2016 | Kim |
| 2016/0203280 A1 | 7/2016 | Neville |
| 2016/0334284 A1 | 11/2016 | Mucharrafille et al. |
| 2016/0363483 A1 | 12/2016 | Tzvieli et al. |
| 2016/0374150 A1* | 12/2016 | Guillaume .............. H05B 3/84 |
| 2019/0132907 A1 | 5/2019 | Kuperman et al. |

FOREIGN PATENT DOCUMENTS

| | | |
|---|---|---|
| CN | 108562363 B | 12/2019 |
| DE | 102007042268 A1 | 3/2009 |
| EP | 0872718 A2 | 10/1998 |
| JP | 2004104632 A | 4/2004 |
| JP | 4604033 B2 | 12/2010 |
| JP | 2014032337 A | 2/2014 |
| KR | 100881713 B1 | 2/2009 |
| RU | 194363 A1 | 2/2006 |
| WO | 2004047421 A2 | 6/2004 |
| WO | 2010089627 A1 | 8/2010 |
| WO | 2014106276 A2 | 7/2014 |
| WO | 2014152681 A2 | 9/2014 |

OTHER PUBLICATIONS

Germanium window, ø 25.4 mm x 3.0 mm, Del Mar Photonics, San Diego, CA., URL: http://www.dmphotonics.com/Germanium-Optics/Germanium%20Windows%20and%20Lenses%20for%20Thermography.htm.

Germanium Windows with AR and DLC Coatings, Del Mar Photonics, Nov. 2012, URL: https://www.youtube.com/watch?v=Chg9SWcJNLw.

Germanium Windows/Substrates, Electro Optical Components, Inc., 2017, URL: http://www.eoc-inc.com/germanium_windows.htm.

International Search Report and Written Opinion of International Searching Authority for PCT/US2018/067722, ISA/RU, Moscow, Russia, dated May 7, 2019.

Preliminary Rejection for Korean Patent Application No. 10-2018-0161769 dated Apr. 16, 2019, KIPO, Korea.

The European Search Report for EP Application No. 18212592.2 dated Apr. 9, 2019, EPO, Munich, Germany.

The First Chinese Office Action for Chinese Patent Application No. 2018115256038, Dec. 16, 2019, CNIPA, China.

U.S. Appl. No. 17/024,057, filed Sep. 17, 2020, Oleg Kuybeda.

Donlon, et. al., "The Calibration and Intercalibration of Sea-Going Infrared Radiometer Systems Using a Low Cost Blackbody Cavity" Journal of Atmospheric and Oceanic Technology, vol. 16, Issue 9, Sep. 1999.

Gomes, et.al., "Uncooled Thermal Camera Calibration and Optimization of the Photogrammetry Process for UAV Applications in Agriculture", MDPI-Sensors 2017, 17,2173.

Hartmann, et. al., "Calibration and Investigation of Infrared Camera Systems Applying Blackbody Radiation", Proceedings of SPIE, vol. 4360, 2001.

Kusnierek, et. al., "Challenges in Using an Analog Uncooled Microbolometer Thermal Camera to Measure Crop Temperature" The International Journal of Agriculture and Engineering, vol. 7, No. 4, Aug. 2014.

Lane, et. al., "Calibration and Measurement Procedures for a High Magnification Thermal Camera", National Institute of Standards and Technology, Gaithersburg, MD, 20899-8223.

Sosnowski, et. al., "The Calibration Stand for Thermal Camera Module with Cooled Infrared Focal Plane Array", Infrared Technology and Applications XXXVI, Proceedings vol. 7660, 2010.

Torres, et. al., "Limitations of a Thermal Camera in Measuring Surface Temperature of Laser-Irradiated Tissues" Wiley Online Library: Lasers in Surgery and Medicine, vol. 10, Issue 6.

Notice of Deficiencies for European Patent Application No. 18212592.2, dated Apr. 16, 2020, EPO, Munich, Germany.

The Second Chinese Office Action for Chinese Patent Application No. 2018115256038, dated Jul. 6, 2020, CNIPA, China.

\* cited by examiner

PROTECTIVE WINDOW FOR RESISTIVE HEATING

TECHNICAL FIELD

The present disclosure relates generally to camera lenses, and more specifically to removing ice and condensation from windows used in cameras.

BACKGROUND

Some of the main issues faced when designing a camera for use in a variety of climates and environments include icing and fogging in front of the camera. Icing and fogging of the camera lens may result in inability to capture images or distortion of captured images. In particular, fogging or icing of lenses due to condensation in infrared cameras results in reduced image quality. This inability to capture images may be particularly significant when the camera is utilized for activities requiring real-time responses and accurate data, for example, in self-driving or assisted driving vehicles.

Some existing solutions for addressing icing and fogging include deploying a heating element near the lens and activating the heating element in response to icing or fogging. However, such heating element deployment requires additional energy and cost, as the heating element must be installed and maintained. Further, such heating elements require enlarging the optical element in the camera, do not provide uniform heating, take a long period of time to heat up, and often utilize more energy than required to remove icing and fogging. In some implementations, the increase in size may make installation of a camera impractical.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

The embodiments disclosed herein include a window for resistive heating. The window comprises: a transparent member having an outer edge, wherein the transparent member is made of a first material, wherein the first material is a low conductivity material; and at least one set of two conductive pads disposed on the outer edge of the transparent member and electrically coupled to at least one source of electricity, wherein each conductive pad is made of a second material, wherein matter disposed on the transparent member is removed via resistive heating when electricity is conducted from the at least one source through the at least one set of two conductive pads and the transparent member.

The embodiments disclosed herein also include a camera apparatus. The camera apparatus comprises: a thermal core including at least one source of electricity, at least one sensor, and a lens; and a window, the window further comprising: a transparent member having an outer edge, wherein the transparent member is made of a first material, wherein the first material is a low conductivity material, wherein the lens is disposed between the transparent member and the at least one sensor; and at least one set of two conductive pads disposed on the outer edge of the transparent member and electrically coupled to the at least one source of electricity, wherein each conductive pad is made of a second material, wherein the second material is a high conductivity material, wherein matter disposed on the transparent member is removed via resistive heating when electricity is conducted from the at least one source through the at least one set of two conductive pad and the transparent member.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
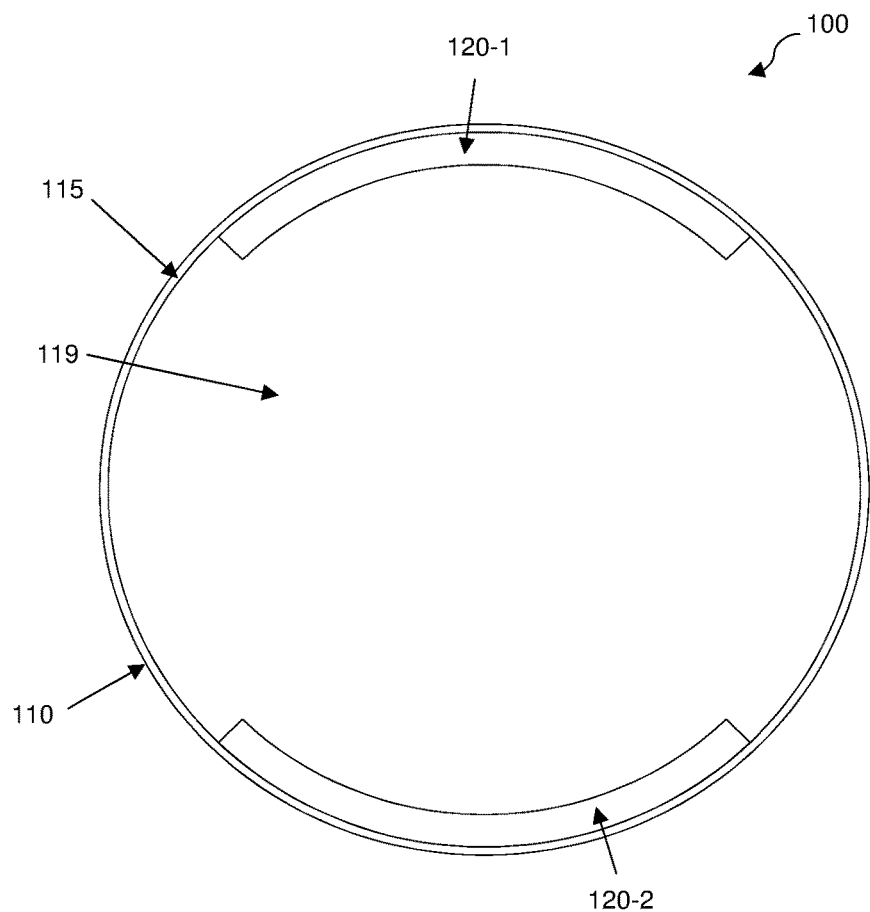
FIG. 1 is a front view of a window according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts throughout several views.

The various disclosed embodiments include a protective window for resistive heating. The window includes a low conductivity transparent member and one or more conductive pads that have high conductivity. The transparent member is made from a first low conductivity material such that resistive heating through the transparent member is sufficient to evaporate condensation or other liquids or solids gathered on the transparent member. For example, the resistive heating may clear icing or fogging of the transparent member. In an embodiment, the transparent member is made from a semiconductor material such as an N-type Germanium semiconductor.

The conductive pads may be disposed along an outer edge of the transparent member, and are made of a second high conductivity material allowing for conduction of electricity to the transparent member. As an example, the second material may be copper. During operation, the conductive pads may be electrically connected to a source of electricity such that electricity is conducted through the conductive pads and the transparent member, thereby heating the transparent member via resistive heating. The resistive heating may cause, for example, evaporation of water droplets or ice formed on the transparent member.

In an embodiment, the source of electricity that is electrically connected to the window may be controlled by a controller in order to ensure that liquids and solids deposited or forming on the window are evaporated, thereby clearing the transparent window. The controller may be configured to determine when an obstruction that can be cleared via heating is disposed on the transparent member and, if so, to cause provision of electrical current to the conductive pads and through the transparent member, thereby causing resistive heating.

In an optional embodiment, the window may be disposed in a camera, with the transparent member disposed in front of a lens of the camera such that the lens is protected against the environment outside the camera. To this end, the window is electrically coupled to a circuitry of the camera such that, during operation, electricity is conducted through the transparent member, thereby causing removal of icing, fogging, or both, via resistive heating of the transparent member. Due to the conduction of electricity through the transparent member, the view of the camera may be rapidly cleared in seconds or fractions thereof.

In a further embodiment, the camera may be an infrared camera for use in, for example, capturing images or video from a vehicle such as a car. The window may be disposed in front of the lens of the infrared camera and electrically connected to a circuitry (e.g., a flex PCB) of the infrared camera such that resistive heating is performed using electricity applied by the circuitry. Using existing electrical components of the camera therefore allows for reduced energy consumption and reduced complexity of the camera components, thereby allowing for efficient heating and further miniaturization of cameras.

FIG. 1 shows a front view of a window 100 for resistive heating according to an embodiment. The window 100 includes a transparent member 110 and two conductive pads 120-1 and 120-2. In the window 100 shown in FIG. 1, the transparent member 110 has an outer edge 115. Each of the conductive pads 120-1 and 120-2 is disposed on the outer edge 115 such that least a portion of the transparent member 110 is not covered by the conductive pads and, thus, is exposed, thereby allowing light to pass through the exposed portion. In an example implementation, the conductive pads 120-1 and 120-2 may be disposed on opposing portions of the transparent member 110.

The conductive pads 120-1 and 120-2 conduct electricity from sources of electricity (not shown) connected thereto. During operation, electricity from the sources of electricity is conducted through the conductive pads 120-1 and 120-2 to the transparent member 110 such that electricity conducted through the transparent member 110 causes, via resistive heating, evaporation of liquids (e.g., water droplets), solids (e.g., ice), or both, from the transparent member 110. In an embodiment, the transparent member 110 is made of a semiconductor material such as, but not limited to, N-type Germanium (GE) semiconductor.

The transparent member 110 is sufficiently resistive to allow for resistive heating. To this end, in an embodiment, the transparent member 110 has a resistivity between 3 ohms centimeter (Ω·cm) and 15 Ω·cm, inclusive. This range of resistivies may be preferred in some applications, for example when using the window 100 in an infrared camera. It should be noted that other resistivities may be utilized for the transparent member 110 depending on the size of the window 100, the power source providing electricity to the window 100, required temperatures for resistive heating, and other factors according to at least some disclosed embodiments.

It should be noted that two conductive pads 120-1 and 120-2 are shown in FIG. 1 merely for example purposes and without limitation on the disclosed embodiments. The window as described herein is not limited to the particular configuration shown in FIG. 1, and may include any number of sets of conductive pads covering any portion of the transparent member 110 without departing from the scope of the disclosure. Each set of conductive pads includes two conductive pads.

Figure 2:
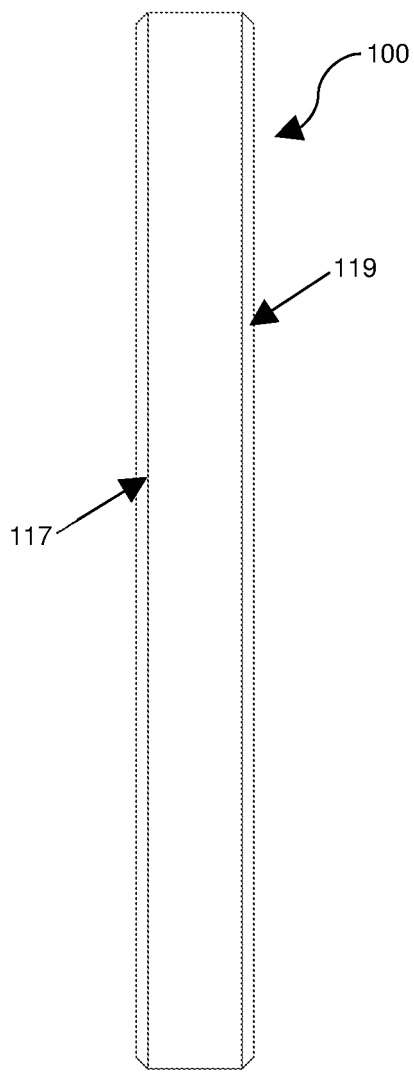
FIG. 2 is a side view of a window according to an embodiment.

FIG. 2 shows a side view of the window 100. As shown in FIG. 2, the transparent member 110 of the window 100 includes a first outer surface 117 and a second outer surface 119. Each of the outer surfaces 117 and 119 may be coated to protect against damage to the transparent member 110, reduce reflection, and the like. In an example implementation, the first outer surface 117 may be coated with a high durability coating to reduce scratching, and the second outer surface 119 may be coated with an anti-reflective (AR) coating to reduce glare. The high durability coating may be, but is not limited to, diamond-like carbon.

In an example implementation, the high durability coating can withstand exposure to adhesion, humidity, and moderate abrasion test conditions. In a further example, the adhesion test conditions may include pressing and removing an adhesive surface of cellophane tape to each coated surface 117 and 119, the humidity test may include placing the window 100 in a test chamber having a temperature of 120 degrees Fahrenheit, and 95-100% relative humidity, and the moderate abrasion test may include rubbing at least 50 strokes across each coated surface 117 and 119.

Figure 3:
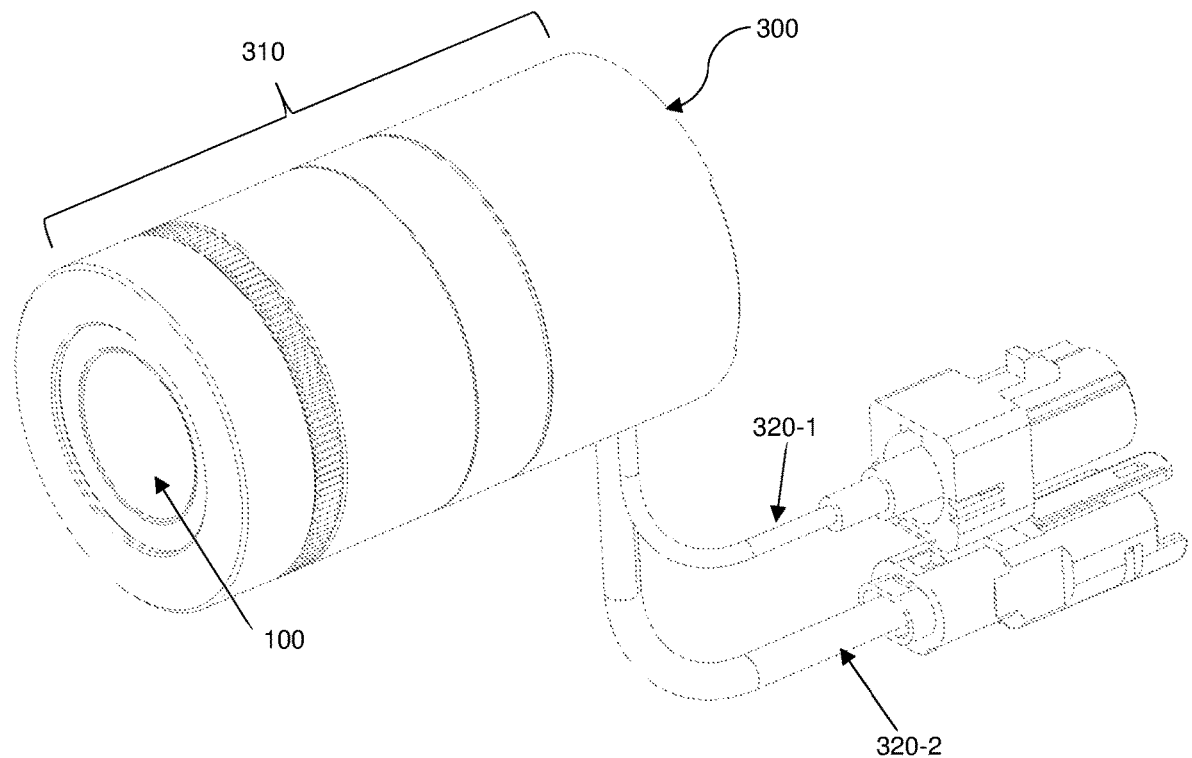
FIG. 3 is an isometric view of an infrared camera including the window according to an embodiment.

FIG. 3 shows an isometric view of a camera 300 including the window 100 according to an embodiment. The camera 300 also includes a thermal core 310 and cables 320-1 and 320-2. The thermal core 310 may include, but is not limited to, a lens, a light sensor, a circuitry, and an electrical connector (components of the thermal core 310 not shown). The thermal core 310 does not require a heating element for defrosting or de-icing of the window 100. Rather, electrical current may be applied by the circuitry via the electrical connector (e.g., an electrode) to the window 100 and, specifically, by conducting electricity through the conductive pads 120 and to the transparent member 110. Thus, the size and complexity of the camera 300 is reduced as compared to cameras implementing a separate heating element for defogging and de-icing. Further, other thermal and electrical losses associated with utilizing a separate heating element (e.g., heat dissipation during conduction, electricity required to turn the heating element on or maintain the heating element being on, etc.) may be minimized.

Figure 4:
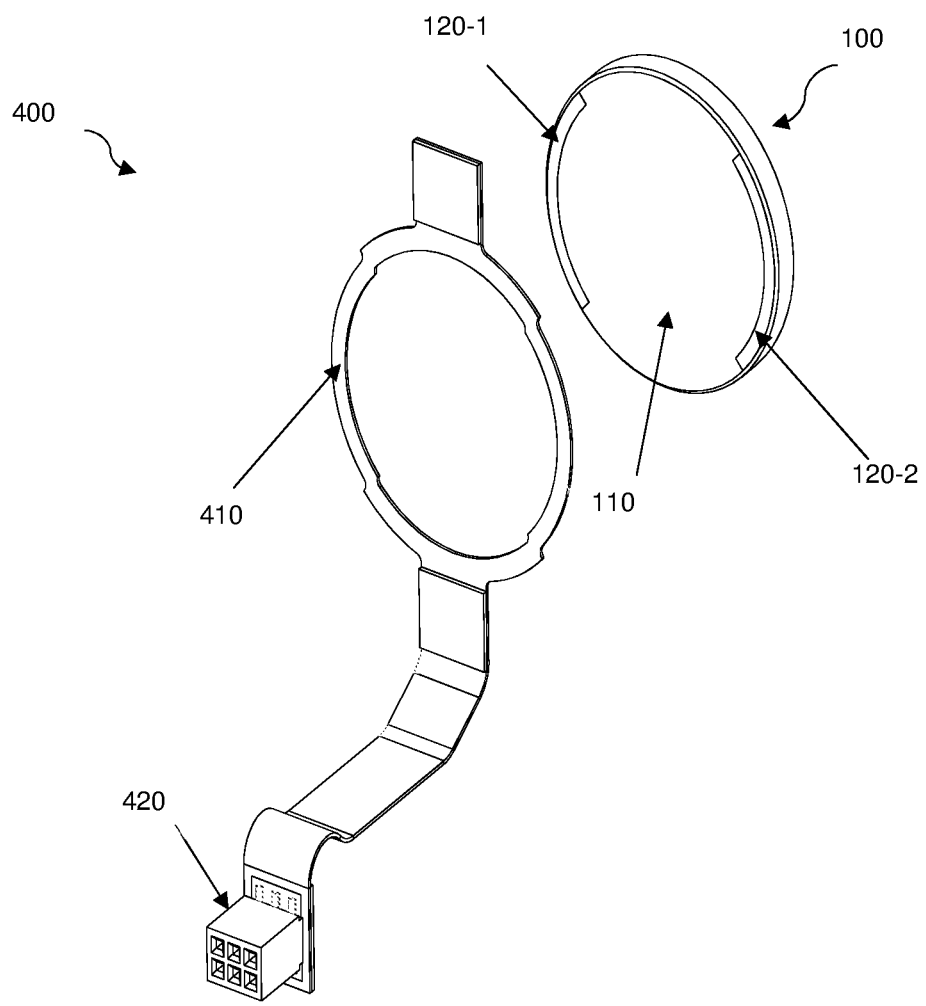
FIG. 4 is an exploded view of a window, a flex PCB, and a power source connector utilized to describe various disclosed embodiments.

FIG. 4 is an example exploded view 400 of the window 100, a flex PCB 410, and a power source connector 420 that may be disposed in, for example, the camera 300 (not shown in FIG. 4). When deployed in the camera 300, the power source connector 420 may be electrically coupled to a power source of the camera 300 such that electricity may be conducted through the power source connector 420 to the flex PCB 410. When such electricity is conducted and the flex PCB 410 is electrically coupled to the conductive pads 120-1 and 120-2, electricity is conducted through the pads 120-1 and 120-2 to the transparent member 110, thereby causing the transparent member to warm up via resistive heating.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

What is claimed is:

1. A window for resistive heating, comprising:
    a transparent member having an outer edge, wherein the transparent member is made of a first material, wherein the first material is a low conductivity material;
    at least one set of two conductive pads disposed on the outer edge of the transparent member and electrically coupled to the transparent member and at least one source of electricity, wherein each conductive pad is made of a second material, and wherein obstructive matter accumulated on the transparent member is eliminated via resistive heating when electricity is conducted from the at least one source through the at least one set of two conductive pads and the transparent member;
    wherein the window is disposed in front of a lens of a camera, and the at least one set of two conductive pads is electrically coupled to electrical components of the camera, such that the at least one source of electricity is provided from the electrical components of the camera; and
    a controller configured to:
        determine when obstructive matter that can be cleared via heating is disposed on the transparent member; and
        cause a provision of electrical current to the conductive pads and through the transparent member causing resistive heating when such obstructive matter is detected.

2. The window of claim 1, wherein the first material is a semiconductor.

3. The window of claim 2, wherein the first material is Germanium.

4. The window of claim 3, wherein the first material is an N-type Germanium semiconductor.

5. The window of claim 1, wherein the second material is copper.

6. The window of claim 1, wherein the at least one source of electricity is a flex printed circuit board (PCB).

7. The window of claim 6, wherein the window is disposed in the camera, the camera including the flex PCB and the lens, wherein the transparent member is disposed between the lens and an environment around the camera.

8. The window of claim 1, wherein the transparent member has a first side and a second side, wherein the first side has a first surface coating and the second side has a second surface coating.

9. The window of claim 8, wherein the first surface coating is a high durability coating.

10. The window of claim 9, wherein the high durability coating is a diamond-like carbon coating.

11. The window of claim 8, wherein the second surface coating is an anti-reflective coating.

12. The window of claim 1, wherein the obstructive matter is removed from the transparent member via evaporation.

13. The window of claim 1, wherein a resistivity of the transparent member is between 3 ohms centimeter ($\Omega$·cm) and 15 $\Omega$·cm, inclusive.

14. A camera apparatus, comprising:
    a thermal core including at least one source of electricity, at least one sensor, and a lens; and
    a window, the window further comprising:
        a transparent member having an outer edge, wherein the transparent member is made of a first material, wherein the first material is a low conductivity material, wherein the lens is disposed between the transparent member and the at least one sensor;
        at least one set of two conductive pads disposed on the outer edge of the transparent member and electrically coupled to the transparent member and the at least one source of electricity, wherein each conductive pad is made of a second material, wherein the second material is a high conductivity material, wherein obstructive matter accumulated on the transparent member is eliminated via resistive heating when electricity is conducted from the at least one source through the at least one set of two conductive pad and the transparent member;
    wherein the window is disposed in front of the thermal core of the camera apparatus, and the at least one set of two conductive pads is electrically coupled to electrical components of the camera, such that the at least one source of electricity is provided from the electrical components of the camera; and
    a controller configured to:
        determine when obstructive matter that can be cleared via heating is disposed on the transparent member; and
        cause a provision of electrical current to the conductive pads and through the transparent member causing resistive heating when such obstructive matter is detected.

15. The camera apparatus of claim 14, wherein the first material is a semiconductor.

16. The camera apparatus of claim 15, wherein the first material is Germanium.

17. The camera apparatus of claim 16, wherein the first material is an N-type Germanium semiconductor.

18. The camera apparatus of claim 14, wherein the at least one source of electricity is a printed circuit board.

19. The camera apparatus of claim 14, wherein the camera apparatus is an infrared camera.

20. A window for resistive heating, comprising:
- a transparent member having an outer edge, wherein the transparent member is made of a first material, wherein the first material is a low conductivity material;
- at least one set of two conductive pads disposed on the outer edge of the transparent member and electrically coupled to the transparent member and at least one source of electricity, wherein each conductive pad is made of a second material, and wherein obstructive matter accumulated on the transparent member is eliminated via resistive heating when electricity is conducted from the at least one source through the at least one set of two conductive pads and the transparent member;
- wherein the window is disposed in a frontal position with respect to optics that guide light to a sensor of a camera, and the at least one set of two conductive pads is electrically coupled to electrical components of the camera, such that the at least one source of electricity is provided from the electrical components of the camera; and
- a controller configured to:
  - determine when obstructive matter that can be cleared via heating is disposed on the transparent member; and
  - cause a provision of electrical current to the conductive pads and through the transparent member causing resistive heating when such obstructive matter is detected.

* * * * *